United States Patent
Chockalingam et al.

(10) Patent No.: US 11,444,045 B2
(45) Date of Patent: Sep. 13, 2022

(54) BONDING STRUCTURES OF SEMICONDUCTOR DEVICES

(71) Applicant: GLOBALFOUNDRIES Singapore Pte. Ltd., Singapore (SG)

(72) Inventors: Ramasamy Chockalingam, Singapore (SG); Juan Boon Tan, Singapore (SG); Xiaodong Li, Singapore (SG); Kai Chong Chan, Singapore (SG); Ranjan Rajoo, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 104 days.

(21) Appl. No.: 16/994,644

(22) Filed: Aug. 16, 2020

(65) Prior Publication Data

US 2022/0052000 A1 Feb. 17, 2022

(51) Int. Cl.
*H01L 23/08* (2006.01)
*H01L 23/52* (2006.01)
*H01L 29/40* (2006.01)
*H01L 23/00* (2006.01)

(52) U.S. Cl.
CPC ............. *H01L 24/05* (2013.01); *H01L 24/45* (2013.01); *H01L 2224/03013* (2013.01); *H01L 2224/0355* (2013.01); *H01L 2224/03464* (2013.01); *H01L 2224/04042* (2013.01); *H01L 2224/05147* (2013.01); *H01L 2224/05547* (2013.01); *H01L 2224/05556* (2013.01); *H01L 2224/05571* (2013.01); *H01L 2224/05573* (2013.01); *H01L 2224/05647* (2013.01); *H01L 2224/45147* (2013.01)

(58) Field of Classification Search
CPC combination set(s) only.
See application file for complete search history.

(56) References Cited

U.S. PATENT DOCUMENTS

| | | | |
|---|---|---|---|
| 7,078,796 B2 | 7/2006 | Dunn et al. | |
| 8,187,965 B2 | 5/2012 | Lin et al. | |
| 8,394,713 B2 | 3/2013 | Mathew | |
| 8,729,395 B2 | 5/2014 | Lee | |
| 9,406,628 B2 * | 8/2016 | Matsumoto | H01L 24/48 |
| 10,325,876 B2 | 6/2019 | Mathew et al. | |
| 10,340,246 B1 | 7/2019 | Zhong et al. | |
| 2003/0057551 A1 * | 3/2003 | Datta | H01L 24/05 257/737 |
| 2006/0016861 A1 * | 1/2006 | Daubenspeck | H01L 24/05 257/E23.021 |

* cited by examiner

Primary Examiner — Niki H Nguyen
(74) Attorney, Agent, or Firm — Anthony Canale (57) ABSTRACT

A semiconductor device is provided that includes a bond pad, an insulating layer, and a bonding structure. The bond pad is in a dielectric layer and the insulating layer is over the bond pad; the insulating layer having an opening over the bond pad formed therein. The bonding structure electrically couples the bond pad in the opening. The bonding structure has a height that at least extends to an upper surface of the insulating layer.

20 Claims, 5 Drawing Sheets

BONDING STRUCTURES OF SEMICONDUCTOR DEVICES

FIELD OF THE INVENTION

The disclosed subject matter relates generally to semiconductor devices, and more particularly to bonding structures of semiconductor devices and methods of forming the same.

BACKGROUND

After completing fabrication, semiconductor devices will go through an electronic packaging process to be assembled for use in electronic devices, for example, in mobile phones, microprocessors of computers, automobiles, or satellites. During the electronic packaging process, the semiconductor devices may be placed on an external packaging component, for example, a lead frame or a printed circuit board (PCB), and external interconnections may be formed to electrically couple the semiconductor devices to the external packaging component. A typical electronic packaging process may include a wire bonding process.

During the electronic packaging process, ionic contamination may be introduced and may result in reduced bond pad reliability, among other things. For example, the ionic contaminants may diffuse along interfaces between the bond pad and surrounding dielectric layers, resulting in reduced adhesion and causing detrimental delamination of the bond pad or other effects resulting from exposure to ionic contamination. As a result, the semiconductor device may exhibit higher failure rate or performance degradation due to effects of the ionic contamination.

Therefore, there is a need to provide bonding structures that improve the bonding reliability of semiconductor devices and methods of forming the same to overcome, or at least ameliorate, the disadvantage described above.

SUMMARY

To achieve the foregoing and other aspects of the present disclosure, bonding structures that improve bonding reliability of semiconductor devices and methods of forming the same are presented.

According to an aspect of the present disclosure, a semiconductor device is provided that includes a bond pad, an insulating layer, and a bonding structure. The bond pad is in a dielectric layer and the insulating layer is over the bond pad; the insulating layer having an opening formed therein. The bonding structure electrically couples the bond pad in the opening. The bonding structure has a height that at least extends to an upper surface of the insulating layer.

According to another aspect of the present disclosure, a method of forming a semiconductor device is provided that includes providing a dielectric layer having a bond pad formed therein. An insulating layer is formed over the dielectric layer and the bond pad. An opening is formed in the insulating layer to expose the bond pad. A bonding structure is formed in the opening; the bonding structure electrically couples the bond pad. The bonding structure has a height that at least extends to an upper surface of the insulating layer.

BRIEF DESCRIPTION OF THE DRAWINGS

The embodiments of the present disclosure will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

Methods are disclosed for forming bonding structures; the bonding structures improve bonding reliability of semiconductor devices. In addition, the present disclosure is not limited to a particular form of external interconnect structure that will be received by the bonding structure. The interconnect structures may include bonding wires, tape-automated bonding (TAB) structures, conductive pillars, solder bumps, conductive adhesives, or the like. Even though an exemplary embodiment is illustrated as using a bonding wire for a wire-bond arrangement, the illustrated embodiment is only one of many examples of the present disclosure which will be apparent to one of skill in the art.

FIGS. 1A to 1E are cross-sectional views of a semiconductor device 100, illustrating various stages of forming a bonding structure that improves the bonding reliability of the semiconductor device, according to an embodiment of the present disclosure. Certain structures may be conventionally fabricated, for example, using known processes and techniques, and specifically disclosed processes and methods may be used to achieve individual aspects of the present disclosure.

Figure 1A:
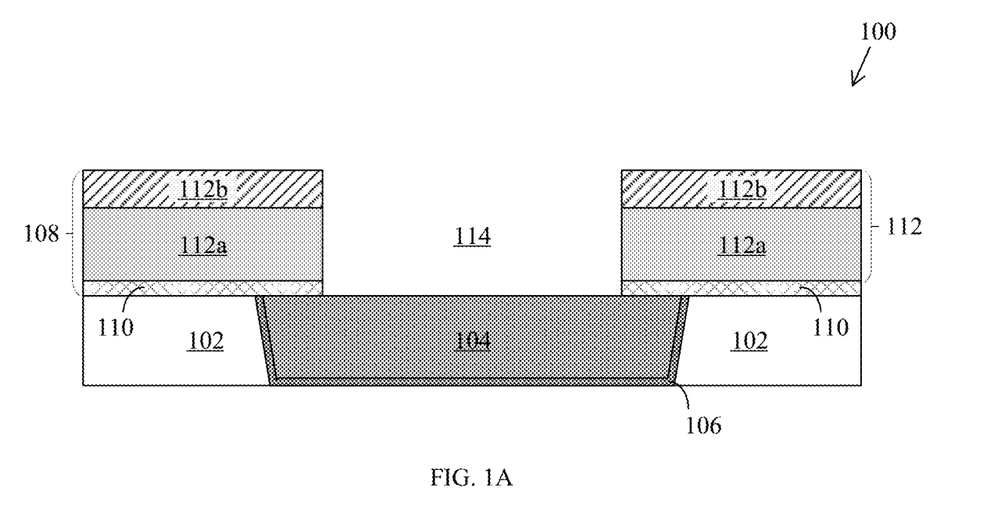
FIGS. 1A-1E are cross-sectional views of a semiconductor device, illustrating a method of forming a bonding structure, according to embodiments of the disclosure.

Referring to FIG. 1A, the semiconductor device 100 may include a dielectric layer 102 and a bond pad 104. An intervening barrier layer 106 may be fabricated between the bond pad 104 and the dielectric layer 102. The dielectric layer 102 may include a dielectric material that is suitable to at least electrically isolate the bond pad 104 from adjacent conductive structures. The dielectric layer 102 may include, but not limited to, silicon dioxide or tetraethyl orthosilicate (TEOS).

The bond pad 104 may be fabricated in the dielectric layer 102 and may have an upper bond pad surface that is substantially coplanar with an upper surface of the dielectric layer 102. The bond pad 104 may be formed of a conductive material, such as aluminum or copper. In an embodiment of the disclosure, the bond pad 104 is preferably formed of copper. Copper has more advantages than aluminum; for example, better electro-migration performance and lower resistivity.

Although not shown, the bond pad 104 may be connected to semiconductor components fabricated in or below the dielectric layer 102. Additionally, it is understood that any number of bond pad may be fabricated in the semiconductor device and that only one bond pad has been illustrated for clarity purposes.

A bond pad 104 is broadly defined herein as a terminal for electrically coupling a circuitry that is formed in an integrated state inside a semiconductor device to the outside of the semiconductor device. The bond pad 104 may include both elevated and recessed structures as well as flat, concave, or convex structures, and other terminal structures.

The semiconductor device 100 may further include a dielectric stack 108. The dielectric stack 108 may include a capping layer 110 and a passivation layer 112. The capping layer 110 may be fabricated over the dielectric layer 102 and the bond pad 104 and the passivation layer 112 may be fabricated over the dielectric layer 102.

The capping layer 110 may include a dielectric material that is suitable for protecting the bond pad 104 from subsequent processing steps. The capping layer 110 may include, but not limited to, silicon carbonitride or silicon nitride. In an embodiment of the disclosure, the capping layer 110 has a thickness of at least 500 Å.

The capping layer 110 may be deposited over the dielectric layer 102 and the bond pad 104 using a deposition technique. As used herein, "deposition techniques" refer to a process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

The passivation layer 112 may be deposited over the capping layer 110 using a deposition technique. The passivation layer 112 may be a dielectric material suitable for protecting the semiconductor device 100 from contamination. The passivation layer 112 may be a one-layer or a multi-layer passivation stack.

In this embodiment of the disclosure, the passivation layer 112 is a multi-layer passivation stack that includes a first layer 112a and a second layer 112b. The first layer of the passivation layer 112a may include TEOS having a thickness of about 7000 Å. The second layer of the passivation layer 112b may include silicon nitride having a thickness of about 3000 Å.

A bond pad opening 114 may be fabricated in the dielectric stack 108 to expose an upper surface of the bond pad 104. In an embodiment of the disclosure, the bond pad opening 114 defined by the dielectric stack 108 has a width that is less than the width of the bond pad 104.

The bond pad opening 114 may be formed by removing portions of the dielectric stack 108 using a patterning technique. The patterning technique may be a one-step or multi-step process. As used herein, "patterning techniques" includes deposition of material or photoresist, patterning, exposure, development, etching, cleaning, and/or removal of the material or photoresist as required in forming a described pattern, structure or opening. Exemplary examples of techniques for patterning include, but not limited to, wet etch lithographic processes, dry etch lithographic processes, or direct patterning processes.

Figure 1B:
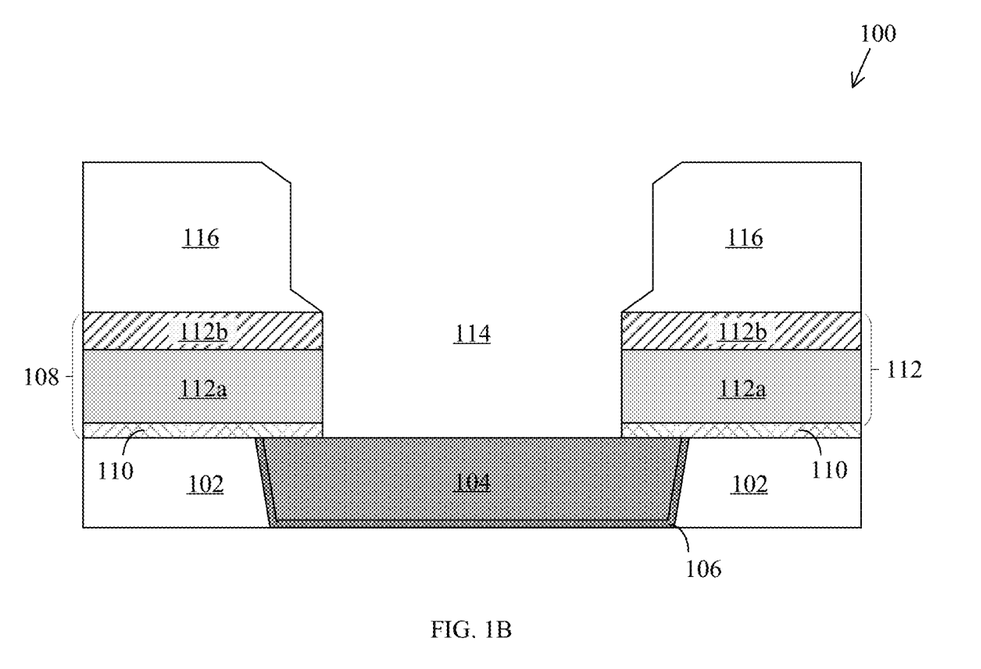

FIG. 1B illustrates the semiconductor device 100 after depositing an insulating layer 116, according to an embodiment of the disclosure. The insulating layer 116 may be deposited over the semiconductor device 100 and in the bond pad opening 114 using a deposition technique. A baking process may be employed after the deposition of the insulating layer 116 to remove solvents and strengthen the integrity of the insulating layer 116.

The bond pad opening 114 may be extended through the insulating layer 116 by removing a portion of the insulating layer 116 over the bond pad 104. The bond pad opening 114 exposes the upper surface of the bond pad 104 to facilitate a bond formation between the bond pad 104 and an external interconnect structure, e.g., a bonding wire 120, in the subsequent assembly process. In an embodiment of the disclosure, the bond pad opening 114 defined by the insulating layer 116 has a width that is wider than the width defined by the dielectric stack 108.

The insulating layer 116 may further undergo a curing process to increase its chemical and thermal stability of the insulating layer 116 after forming the bond pad 104 opening 114. In an embodiment of the disclosure, the insulating layer 116 may include a photosensitive polyimide (PSPI) material. However, it is understood that polyimide material is just one of the possible insulating materials that may be employed by one skilled in the art and other insulating materials may also be employed without departing from the spirit and scope of the present disclosure.

Figure 1C:
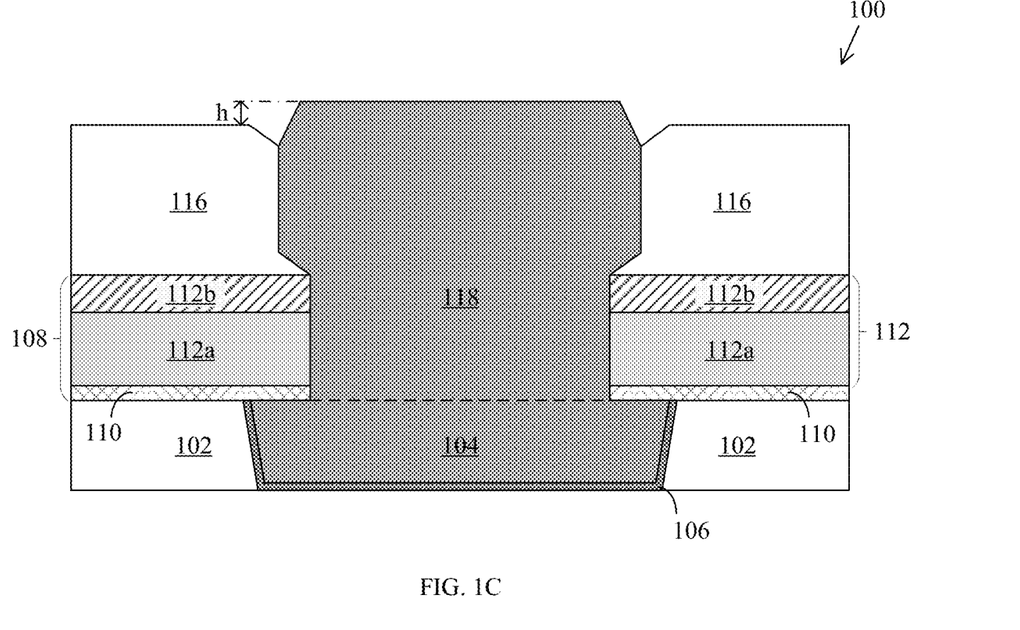

FIG. 1C illustrates the semiconductor device 100 after forming a bonding structure 118, according to an embodiment of the disclosure. The bonding structure 118 may be formed by depositing a conductive material in the bond pad opening 114 using a deposition process, for example, an electroless plating process. The bonding structure 118 may abut and coalesce with the bond pad 104; an arbitrary interface between the bond pad 104 and the bonding structure 118 has been demarcated by a dashed line. In an embodiment of the disclosure, the bonding structure 118 is a pedestal of conductive material.

The bonding structure 118 may be selectively deposited, i.e., deposition only occurs over certain surfaces, such as over the exposed upper surface of the bond pad 104, while other surfaces remain substantially free of the conductive material. In an embodiment of the disclosure, the bonding structure 118 is preferably formed of copper. As the bonding structure 118 and the bond pad 104 are formed of essentially the same material, a strong interfacial bond of substantial homogeneity may be formed between the bond pad 104 and the bonding structure 118.

In this embodiment of the disclosure, the bonding structure 118 may be formed by overfilling the bond pad opening 114 with the conductive material to a height h above the insulating layer 116; the bonding structure 118 protruding above the insulating layer 116. During the deposition process, the conductive material may be confined to a width as wide as the bond pad opening 114. When the deposition of the conductive material surpasses the insulating layer 116, the conductive material is no longer confined within the bond pad opening 114 and forms a convex upper surface. It should be appreciated that careful process control and optimization can control the overfill amount of the conductive material.

Figure 1D:
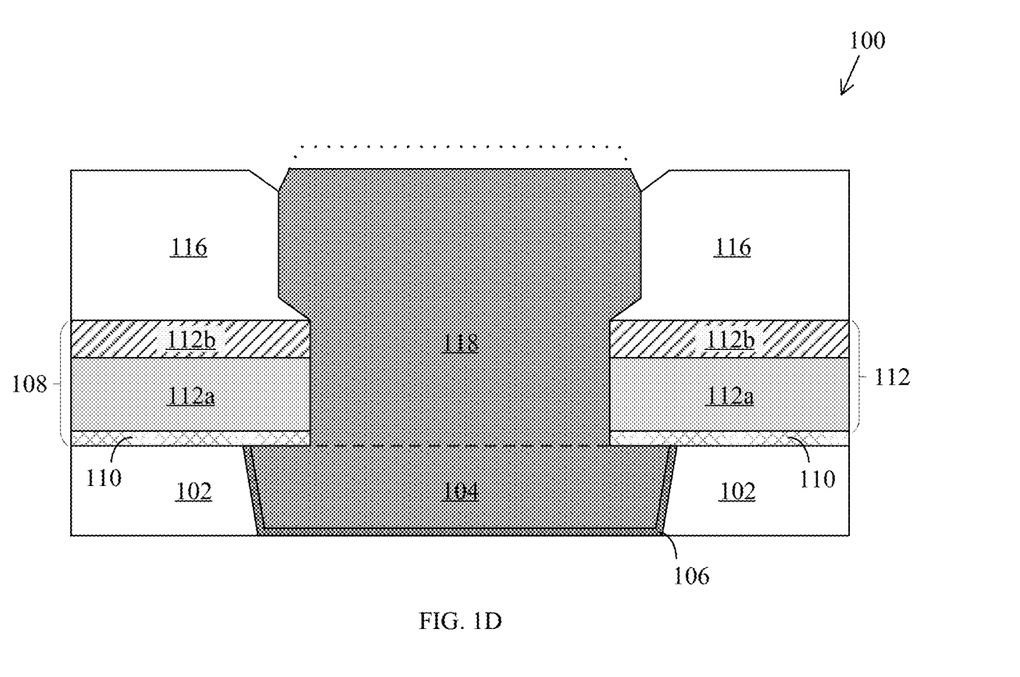

FIG. 1D illustrates the semiconductor device 100 after performing a material removal process on the bonding structure 118, according to an embodiment of the disclosure. The material removal process may remove the protruding portion of the bonding structure 118 to form the bonding structure 118 having a height that at least extends to an upper surface of the insulating layer 116. The bonding structure 118 may have an upper surface that is substantially coplanar with the upper surface of the insulating layer 116. In an embodiment of the disclosure, the upper surface of the bonding structure 118 may be substantially flat. A dotted line outlined the removed portion of the bonding structure 118. A portion of the insulating layer 116 may or may not be removed during the material removal process.

The material removal process may be a mechanical process, a chemical process, or a combination thereof. For example, a mechanical process may include a diamond bit cutting or a nanoimprint process. The diamond bit cutting process, also referred to as a flycutting process, involves a diamond cutting bit moving over a sample performing a milling type operation, removing all material it comes into contact with. The nanoimprint process involves pressing (imprinting) a nanometer-scale mask onto a sample's surface, thereby flatting the surface. In another example, a chemical process may include an etching process. The chemical process is preferably selective to the conductive material of the bonding structure 118 such that the insulating layer 116 may remain predominantly intact during the material removal process.

Figure 1E:
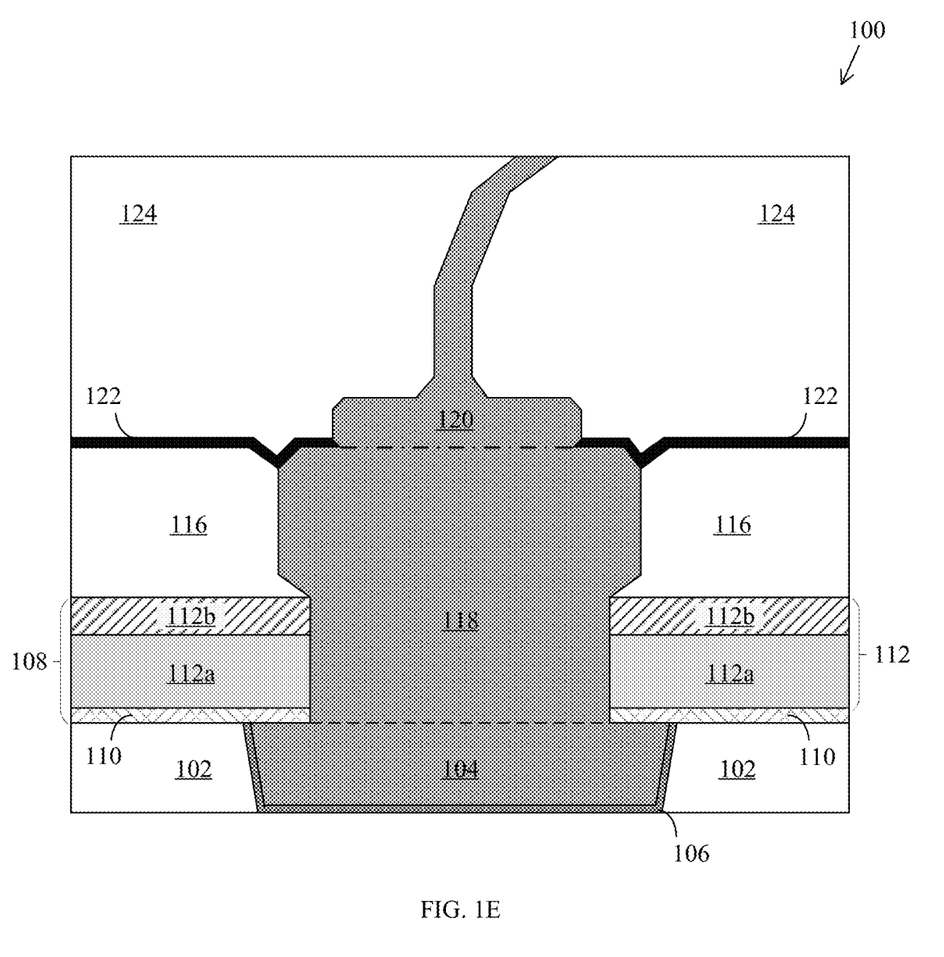

FIG. 1E illustrates the semiconductor device 100 after attaching a bonding wire 120 over the bonding structure 118, according to an embodiment of the disclosure. The bonding wire 120 is typically attached during an assembly process. The bonding wire 120 may be attached directly over the bond pad 104.

A barrier liner 122 may be conformally deposited over the insulating layer 116 and the bonding structure 118 before attachment of the bonding wire 120. The barrier liner 122 may be conformally deposited using a deposition technique. The barrier liner 122 may include a material that is suitable for at least impeding diffusion of ionic contaminants along the interfacial boundaries; for example, between the bonding structure 118 and the insulating layer 116. The barrier liner 122 may also include the capability of protecting the bonding structure 118 from natural oxidation and environmental contamination. In an embodiment of the disclosure, the barrier liner 122 may include a dielectric material such as, but not limited to, silicon nitride, silicon carbonitride, or the like. In another embodiment of the disclosure, the barrier liner 122 may include a transition metal material such as, but not limited to, palladium, gold, an alloy of nickel/gold/palladium, or the like.

As used herein, the terms "palladium" and "gold" include not only elemental palladium and gold but palladium and gold having other trace elements or in various alloyed combinations with other elements as known in the semiconductor art, as long as the chemical and physical properties of those elements remain substantially unaffected.

The bonding wire 120 may be mechanically attached onto the bonding structure 118 using a wire bonding process, such as an ultrasonic bonding process. The ultrasonic bonding process is a solid-state process in which the bonding wire 120 to be attached is held upon the upper surface of the bonding structure 118 under bias pressure and locally applying thereto a high-frequency vibratory energy. The vibratory energy causes the bonding wire 120 and the bonding structure 118 to melt slightly and the bias pressure applied fuses them together, forming a permanent bond.

The portion of the barrier liner 122 at which the bonding wire 120 is in direct contact may be mechanically broken during the wire bonding process; the interface being demarcated by a dash-dot line. The remaining portions of the barrier liner 122 over the bonding structure 118 and the insulating layer 116 remain intact and may serve to protect the bonding structure 118 from natural oxidation and environmental contamination.

The bonding wire 120 used in a wire bonding process is typically gold, copper, or palladium-coated copper. In an embodiment of the disclosure, the bonding wire 120 is preferably copper. Copper wires have a huge cost advantage over gold wires, as well as having superior material properties, such as higher thermal conductivity and higher mechanical strength. Copper wires can be used at smaller diameters while providing the same performance as gold wires. As the material of the bonding wire 120 and the material of the bonding structure 118 may be formed of essentially the same material, the melting and fusing of the bonding wire 120 and the bonding structure 118 during the wire bonding process may be easily achieved to form substantially strong interfacial bonds between the bonding wire 120 and the bonding structure 118.

A mold compound 124 may be deposited over the semiconductor device 100. The mold compound 124 may cover the barrier liner 122 and encapsulates a portion of the bonding wire 120. The mold compound 124 may be a viscous polymeric material. The mold compound 124 may be subjected to a curing process to harden and strengthen the integrity of the mold compound 124. The mold compound 124 may volumetrically shrink after the curing process. The barrier liner 122 may further prevent potential cracks or mechanical damage from propagating into the semiconductor device 100.

Figure 2A:
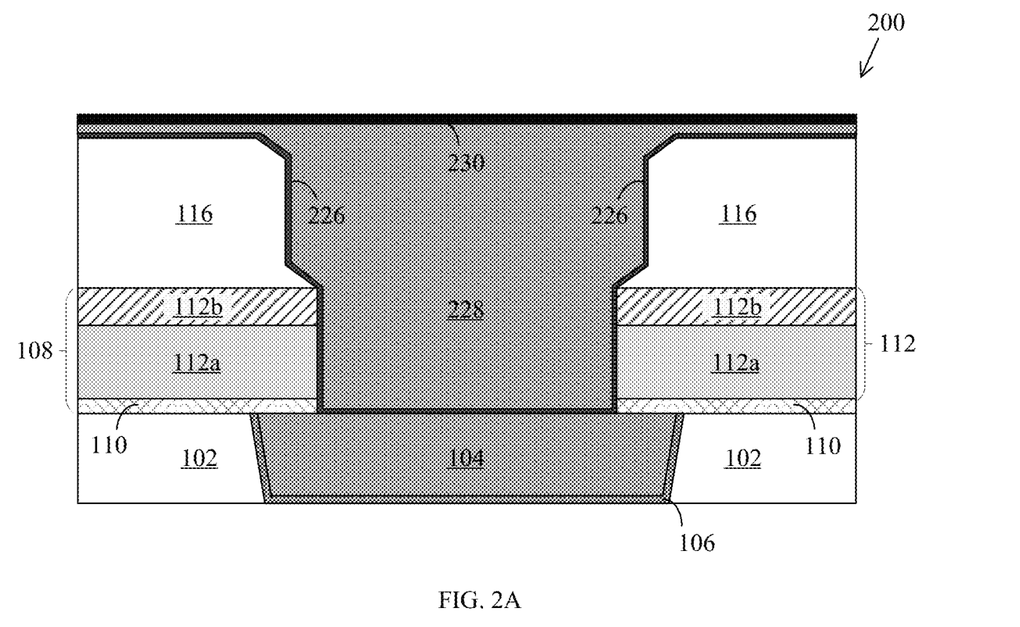
FIGS. 2A-2C are cross-sectional views of a semiconductor device, illustrating a method of forming a bonding structure, according to alternative embodiments of the disclosure.
Figure 2B:
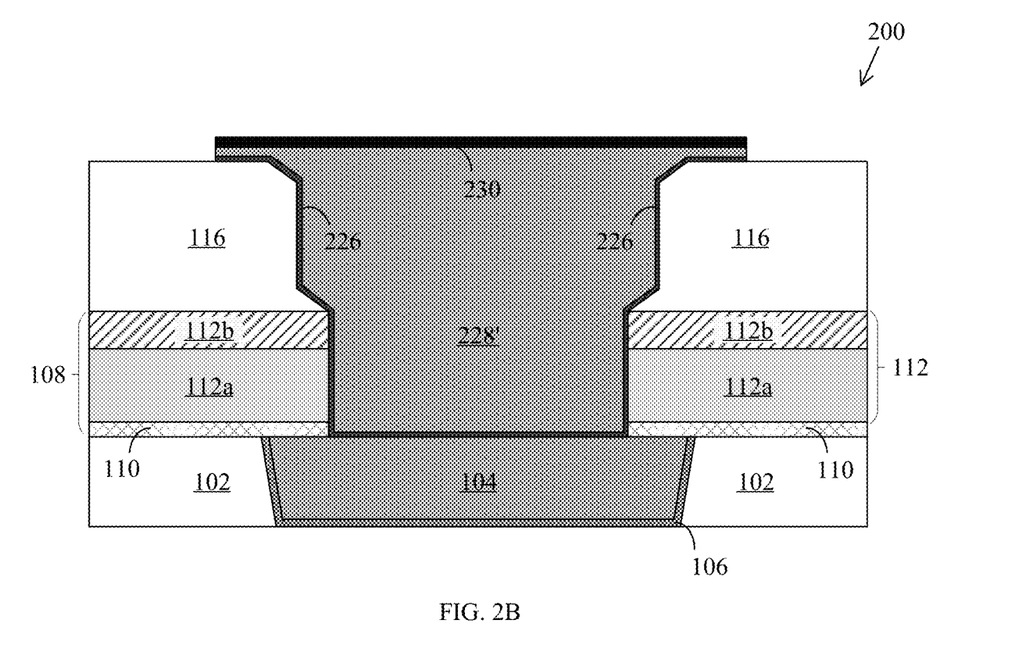
Figure 2C:
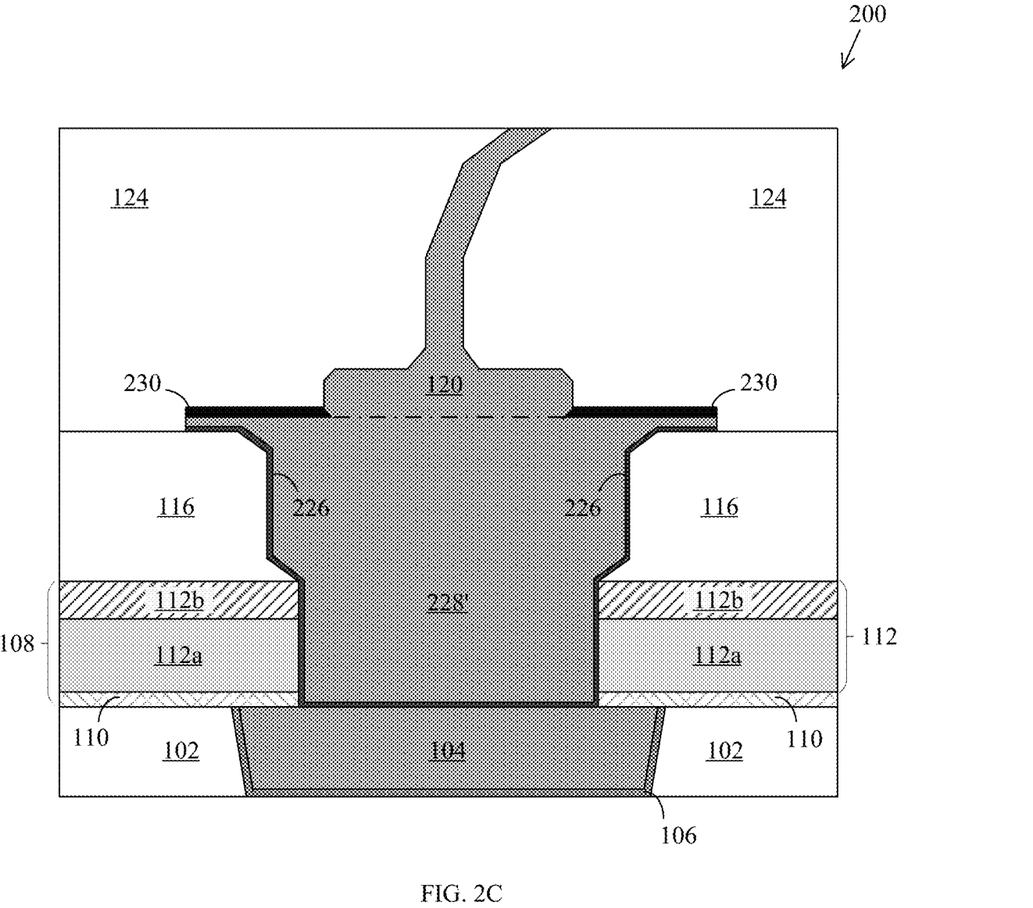

FIGS. 2A to 2C are cross-sectional views of a semiconductor device 200, illustrating various stages of forming a bonding structure that improves the bonding reliability of the semiconductor device, according to an alternative embodiment of the present disclosure.

FIG. 2A continues from the embodiment illustrated in FIG. 1B, after depositing an adhesion layer 226, a conductive layer 228, and a barrier layer 230. The adhesion layer 226 may be conformally deposited using a deposition technique and the adhesion layer 226 overlays the insulating layer 116, on sidewalls of the insulating layer 116 and the dielectric stack 108 within the bond pad opening 114, and over the bond pad 104 exposed in the bond pad opening 114. The adhesion layer 226 may include a material that is suitable for improving adhesion between the dielectric materials and the conductive layer 228. In an embodiment of the disclosure, the adhesion layer 226 may include titanium (Ti), tantalum (Ta), tantalum nitride (TaN), tantalum nitride silicon (TaNSi), tungsten (W), titanium nitride (TiN), titanium nitride silicon (TiNSi) and the like.

The conductive layer 228 may be deposited onto the adhesion layer 226 using a using a deposition technique, for example, an electroplating process. A planarization process may be employed to form a substantially leveled top surface of the conductive layer 228.

As illustrated in FIG. 2A, the conductive layer 228 overfills the bond pad opening 114. However, it is understood that the conductive layer 228 may not overfill the bond pad opening 114 and may substantially fill the bond pad opening 114 to form a substantially coplanar surface with an upper surface of the insulating layer 116. In an embodiment of the disclosure, the conductive layer 228 may include copper.

The barrier layer 230, which is analogous to the barrier liner 122 in FIG. 1E, may be deposited onto the conductive layer 228 using a fabrication technique similar to that described with respect to FIG. 1E.

FIG. 2B illustrates the semiconductor device 200 after forming a bonding structure 228' over the bond pad 104, according to an embodiment of the disclosure. The bonding structure 228' may be formed by a material removal process, for example, a patterning technique, to remove portions of the adhesion layer 226, the conductive layer 228, and the barrier layer 230; the conductive layer 228 being defined to form the bonding structure 228'.

The bonding structure 228' has a height that at least extends to an upper surface of an insulating layer 116. In this embodiment of the disclosure, a portion of the bonding structure 228' overlays the insulating layer 116 and having sidewalls over the insulating layer 116. In another embodiment of the disclosure, the bonding structure 228' is confined within the insulating layer 116, even though this embodiment is not shown in the accompanying drawings.

FIG. 2C illustrates the semiconductor device 200 after attaching a bonding wire 120 over the bonding structure 118, according to an embodiment of the disclosure. Similar to the embodiment in FIG. 1E, the bonding wire 120 may be attached during an assembly process and may be attached directly over the bond pad 104.

The bonding wire 120 may be mechanically attached onto the bonding structure 228' using a wire bonding process, such as an ultrasonic bonding process as described above. The portion of the barrier layer 230 at which the bonding wire 120 is in direct contact with, may be mechanically broken during the wire bonding process; the interface being demarcated by a dash-dot line. The remaining portions of the barrier layer 230 over the bonding structure 228' remain intact and may serve to protect the bonding structure 228' from natural oxidation and environmental contamination. A mold compound 124 may be subsequently deposited over the semiconductor device 200 to encapsulate a portion of the bonding wire 120.

As presented in the above detailed description, bonding structures that improve the bonding reliability of semiconductor devices and methods of forming the same are presented. An insulating layer may be fabricated over a bond pad, the insulating layer having a bond pad opening formed therein to expose a portion of the bond pad. The bonding structure may be fabricated in the bond pad opening and electrically couples the bond pad. The bonding structure has a height that at least extends to an upper surface of the insulating layer. An external interconnect structure, such as a bonding wire, may be fabricated over the bonding structure to provide electrical coupling the bond pad and the external packaging component.

The bonding wire may be attached during an assembly process and ionic contaminants may be potentially introduced during the process. The ionic contaminants may include halides contaminants, such as chlorides, fluorides, bromides, and may also include metallic contaminants, such as sodium ions. The ionic contaminants may diffuse along boundaries having weak interfacial bonds, such as a boundary between a dielectric material and a conductive material, and may cause detrimental delamination of the bond pad or other effects resulting from exposure to ionic contamination.

The bonding structure advantageously improves the bonding reliability of the semiconductor device. The bonding structure is an intervening conductive structure that electrically couples the bond pad and the external interconnect structure. The bonding surface of the bonding structure, to which the bonding wire is attached, is being elevated from the bond pad, placing the bond pad at a distance further from a potential presence of ionic contaminants introduced from an assembly process. The potential diffusion of ionic contaminants reaching the bond pad may be reduced; thereby minimizing the potential occurrence of bond pad delamination.

Additionally, by forming the bonding structure having essentially the same conductive material as the bond pad, the bonding structure and the bond pad are able to form strong interfacial bonds that further improve the bonding reliability of the semiconductor device.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
a bond pad in a dielectric layer;
a passivation layer over the dielectric layer and the bond pad;
an insulating layer over the passivation layer;
a bonding structure through the passivation layer and the insulating layer, wherein the bonding structure has a height that at least extends to an upper surface of the insulating layer and is electrically coupled with the bond pad; and a dielectric barrier liner over an upper surface of the bonding structure.

2. The semiconductor device of claim 1, wherein the bonding structure has a first width defined by an opening in the passivation layer and a second width defined by an opening in the insulating layer, the first width being narrower than the second width.

3. The semiconductor device of claim 2, wherein the first width is less than the width of the bond pad.

4. The semiconductor device of claim 1, wherein the bond pad and the bonding structure comprise the same conductive material.

5. The semiconductor device of claim 4, wherein the conductive material is copper.

6. The semiconductor device of claim 1, further comprises a bonding wire directly over the bond pad.

7. The semiconductor device of claim 6, wherein the bonding wire comprises a same conductive material as the bonding structure.

8. The semiconductor device of claim 1, wherein the bonding structure abuts upon the bond pad.

9. The semiconductor device of claim 8, wherein the bonding structure has an upper surface that is substantially coplanar with the upper surface of the insulating layer.

10. The semiconductor device of claim 1, wherein a portion of the bonding structure overlays the insulating layer.

11. The semiconductor device of claim 1, further comprises an adhesion layer between the bonding structure and the bond pad.

12. A method of forming a semiconductor device, comprising:

forming a bond pad formed in a dielectric layer;

forming a passivation layer over the dielectric layer and the bond pad;

forming an insulating layer over the passivation layer;

forming an opening in the passivation layer and the insulating layer to expose the bond pad;

forming a bonding structure in the opening electrically coupling the bond pad, wherein the bonding structure has a height that at least extends to an upper surface of the insulating layer; and forming a dielectric barrier liner over an upper surface of the bonding structure.

13. The method of claim 12, wherein the formation of the bonding structure further comprises forming an upper surface that is substantially coplanar with the upper surface of the insulating layer.

14. The method of claim 13, wherein the formation of the substantially coplanar upper surface of the bonding structure comprises a mechanical material removing process.

15. The method of claim 14, wherein the mechanical material removing process comprises a diamond bit cutting process.

16. The method of claim 12, wherein the formation of the bonding structure comprises electroless plating of conductive material onto the bond pad.

17. The method of claim 12, further comprises forming a conformal adhesion layer in the opening and over the insulating layer.

18. The method of claim 17, further comprises electroplating a conductive material onto the adhesion layer to at least fill the opening.

19. A semiconductor device comprising:

a bond pad in a dielectric layer;

a passivation layer over the dielectric layer and the bond pad;

an insulating layer over the passivation layer, the insulating layer having an upper surface;

an opening through the passivation layer and the insulating layer, the opening exposes the bond pad;

a bonding structure having a uniform material composition in the opening, wherein the bonding structure at least fills to the top of the opening with a height that at least extends to the upper surface of the insulating layer and is electrically coupled with the bond pad; and a barrier liner over the bonding structure.

20. The semiconductor device of claim 19, wherein the barrier liner comprises a dielectric or a transition metal.

* * * * *